US007119765B2

United States Patent
Redecker et al.

(10) Patent No.: US 7,119,765 B2
(45) Date of Patent: Oct. 10, 2006

(54) CIRCUIT FOR DRIVING MATRIX DISPLAY PANEL WITH PHOTOLUMINESCENCE QUENCHING DEVICES, AND MATRIX DISPLAY APPARATUS INCORPORATING THE CIRCUIT

(75) Inventors: Michael Redecker, Berlin (DE); Joerg Fischer, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 299 days.

(21) Appl. No.: 10/436,099

(22) Filed: May 13, 2003

(65) Prior Publication Data

US 2004/0046715 A1    Mar. 11, 2004

(30) Foreign Application Priority Data

Aug. 23, 2002  (EP)  .................. 02090299
Feb. 3, 2003   (KR)  .............. 10-2003-0006567

(51) Int. Cl.
*G09G 3/20*  (2006.01)

(52) U.S. Cl. .......................... 345/55; 345/82
(58) Field of Classification Search ............. 345/82, 345/76, 55
See application file for complete search history.

(56) References Cited

U.S. PATENT DOCUMENTS

| 5,952,789 | A  |   | 9/1999  | Stewart et al. |   |
|-----------|----|---|---------|----------------|---|
| 5,990,629 | A  |   | 11/1999 | Yamada et al.  |   |
| 6,157,356 | A  |   | 12/2000 | Troutman       |   |
| 6,229,508 | B1 | * | 5/2001  | Kane ............................ | 345/82 |
| 6,518,700 | B1 |   | 2/2003  | Friend et al.  |   |
| 6,583,775 | B1 | * | 6/2003  | Sekiya et al. ................ | 345/76 |
| 6,611,245 | B1 | * | 8/2003  | Edwards ...................... | 345/76 |
| 2001/0026251 | A1 | * | 10/2001 | Hunter et al. ................ | 345/55 |
| 2002/0027537 | A1 |   | 3/2002  | Redecker       |   |
| 2002/0047839 | A1 |   | 4/2002  | Kasai          |   |
| 2002/0118150 | A1 |   | 8/2002  | Kwon           |   |
| 2002/0121856 | A1 | * | 9/2002  | Tsai ........................... | 313/491 |
| 2002/0195968 | A1 | * | 12/2002 | Sanford et al. .......... | 315/169.3 |

FOREIGN PATENT DOCUMENTS

| CN | 1361510     | 7/2002 |
|----|-------------|--------|
| EP | 942 407     | 9/1999 |
| JP | 2002-169510 | 6/2002 |

OTHER PUBLICATIONS

Springer-Verlag; XP002216831.

* cited by examiner

*Primary Examiner*—Kent Chang
*Assistant Examiner*—Tammy Pham
(74) *Attorney, Agent, or Firm*—Leydig, Voit & Mayer, Ltd.

(57) ABSTRACT

A circuit for driving a photoluminescence quenching device (PQD) of a flat panel display, each PQD defining a pixel at a crossing of a scan line and a data line, includes an activation transistor and a driver transistor. The activation transistor is turned on according to potential of the scan line and outputs a potential of the data line. The driver transistor is connected between a reference voltage terminal of the circuit and a PQD. When the activation transistor is turned on, the driver transistor applies to the anode of the PQD a potential that is applied to the reference voltage terminal, according to the potential of the data line. In an emissive mode of the PQD, when the driver transistor is turned on, a forward voltage is applied between the anode and the cathode of the PQD so that the PQD emits light. In a re-emissive mode, when the driver transistor is turned off, no voltage is applied between the anode and the cathode of the PQD so that the PQD emits light by photoluminescence.

20 Claims, 8 Drawing Sheets

CIRCUIT FOR DRIVING MATRIX DISPLAY PANEL WITH PHOTOLUMINESCENCE QUENCHING DEVICES, AND MATRIX DISPLAY APPARATUS INCORPORATING THE CIRCUIT

CROSS-REFERENCE TO RELATED APPLICATIONS

This application claims the priority of EP Application No. 02090299.5, filed on Aug. 23, 2002 and Korean Patent Application No. 2003-6567, filed on Feb. 3, 2003, which are incorporated herein in their entirety by reference.

BACKGROUND OF THE INVENTION

1. Field of the Invention

The present invention relates to a circuit for driving a photoluminescence quenching device (PQD) and a matrix display apparatus incorporating the circuit, and a plurality of PQDs. More particularly, the invention relates to a circuit for driving a matrix display panel including PQDs as pixels, which are defined by crossings of scan lines and data lines, and a matrix display apparatus incorporating the circuit.

2. Description of the Related Art

Flat panel displays using organic light-emitting diodes (OLEDs) provide high brightness and a wide viewing angle. Using the self-emissive mode, OLEDs do not require any back light and are thus very effective under conditions of low to medium ambient light. However, with high ambient light, such as direct sunlight, a disproportionately large amount of power must be supplied to OLEDs to obtain required brightness. Moreover, high current is required in order to activate the elements having a light emitting structure. For this reason, reflective and re-emissive technologies, applied to liquid crystal displays (LCDs), are very effective for LCDs in a variety of ambient light conditions. However, when using these technologies, back light is required under conditions with low ambient light, which results in an increase in the dimensions of displays and increased power consumption.

The structure of OLEDs that can be operated both in emissive and re-emissive modes is disclosed in U.S. Published Patent Application 2002 0027537A1. A PQD has a structure similar to that of an OLED and can be operated in an emissive mode without back light and a re-emissive mode.

Driver circuits activating OLEDs are known from U.S. Pat. Nos. 6,157,356, 5,952,789, and 6,518,700. All of these driver circuits have a disadvantage in that they can realize only the emissive mode of operation of an OLED. Under conditions with high ambient light, a high current is required to activate the OLED elements in the emissive mode. This high current requirement leads to an increased fabrication cost.

SUMMARY OF THE INVENTION

The present invention provides a circuit for driving a matrix display panel in which photoluminescence quenching devices (PQDs) can be operated in both an emissive mode and a re-emissive mode, thereby providing satisfactory brightness with a low current under conditions with high ambient light, so that power consumption and fabrication cost of the display panel and a matrix display apparatus using the circuit can be reduced.

According to an aspect of the present invention, there is provided a circuit for driving a PQD in a matrix display panel using PQDs, each PQD being a pixel at a crossing point of a scan line and a data line. The circuit for driving a PQD includes an activation transistor and a driver transistor. The activation transistor may be turned on according to a potential of the scan line connected to the circuit and, when turned on, outputs a potential of the data line connected to the circuit. The driver transistor is connected between a reference voltage terminal and a PQD driven by the circuit. When the activation transistor is turned on, a potential applied to the reference voltage terminal is applied to an anode of the PQD according to the potential of the data line. In an emissive mode, when the driver transistor is turned on, a forward voltage is applied between an anode and cathode of the PQD so that the PQD emits light. In a re-emissive mode, when the driver transistor is turned off, no voltage is applied between the anode and cathode of the PQD so that the PQD produces light by photoluminescence.

Using to the circuit of the present invention, a PQD can be operated in the emissive mode and re-emissive mode, depending on the operation of corresponding activation and driver transistors of the circuit. In other words, each PQD in a matrix display driven by a corresponding driving circuit can be operated in the emissive mode under conditions of low ambient light and in the re-emissive mode under conditions of high ambient light. Accordingly, satisfactory brightness can be produced under conditions with high ambient light and low current so that the power consumption and fabrication cost of a display can be reduced.

According to another aspect of the present invention, there is provided a matrix display apparatus including a matrix display panel and a plurality of driving circuits. The matrix display panel includes PQDs, each of which is a pixel at a crossing of a scan line and a data line. Each driving circuit applies a forward voltage between an anode and a cathode of a corresponding PQD according to a gray scale value in an emissive mode, and applies a reverse voltage between the anode and the cathode of the PQD according to a gray scale value in a re-emissive mode.

According to a further aspect of the invention, a circuit for driving a photoluminescence quenching device having an anode and a cathode, and defined as a pixel at crossing of a scan line and a data line, includes an activation transistor having a control electrode connected to the scan line and an input electrode connected to the data line, the activation transistor being turned on in response to potential of the scan line, and, when turned on, outputting potential of the data line; and a driver transistor having a control electrode connected to an output electrode of the activation transistor, the driver transistor being connected between a reference voltage terminal of the circuit and the PQD and, when the activation transistor is turned on, applying to the anode of the PQD the potential that is applied to the reference voltage terminal, according to the potential of the data line, wherein in an emissive mode of operation of the PQD, when the driver transistor is turned on, a forward voltage is applied between the anode and the cathode of the PQD so that the PQD emits light, and in a re-emissive mode of operation of the PQD, when the driver transistor is turned off, no voltage is applied between the anode and the cathode of the PQD so that the PQD produces light by photoluminescence.

According to yet another aspect of the invention a matrix display apparatus includes a plurality of scan lines; a plurality of data lines, orthogonal to and crossing the scan lines; a plurality of photoluminescence quenching devices, each PQD having an anode and a cathode, defining a pixel, and being located at a respective crossing of one of the scan lines and one of the data lines; and a plurality of driving circuits, each driving circuit driving a corresponding PQD and applying a forward voltage between the anode and the cathode of the corresponding PQD, according to a gray scale value, in an emissive mode of operation of the corresponding PQD, and applying a reverse voltage between the anode and the cathode of the corresponding PQD, according to the gray scale value, in a re-emissive mode of operation of the corresponding PQD.

Further, in the matrix display apparatus, each of driving circuits includes an activation transistor having a control electrode connected to a respective scan line and an input electrode connected to a respective data line, the activation transistor being turned on in response to potential of the respective scan line, and, when turned on, outputting potential of the respective data line; and a driver transistor having a control electrode connected to an output electrode of the activation transistor, the driver transistor being connected between a reference voltage terminal of the driving circuit and the corresponding PQD and, when the activation transistor is turned on, applying to the anode of the corresponding PQD potential that is applied to the reference voltage terminal in response to the potential of the respective data line.

In the driving circuits, a respective storage capacitor is connected between control electrodes and input electrodes of the respective driver transistors.

BRIEF DESCRIPTION OF THE DRAWINGS

The above and other features and advantages of the present invention will become more apparent by describing in detail a preferred embodiment thereof with reference to the attached drawings in which.

DETAILED DESCRIPTION OF THE INVENTION

Figure 1:
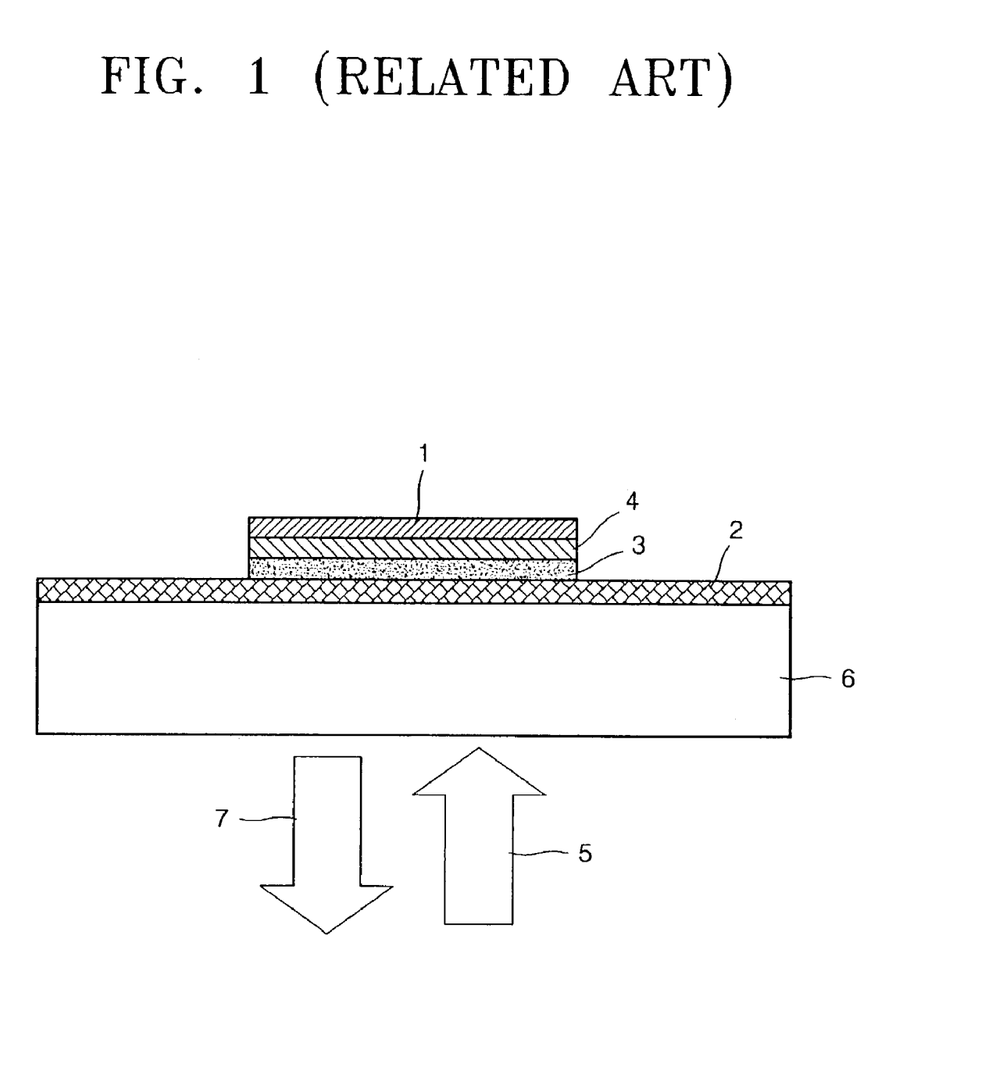
FIG. 1 is a cross-section of a typical photoluminescence quenching device.

The structure of a typical photoluminescence quenching device will be described with reference to FIG. 1. A light-permeable anode 2 is arranged on a transparent substrate 6. A hole injection layer 3 is disposed on the light-permeable anode 2. An emitter material layer 4 is disposed on the hole injection layer 3. A cathode 1 is located on the emitter material layer 4. When polymer materials are used for the hole injection layer 3 and the emitter material layer 4, the hole injection layer 3 can be formed by dispersing polyethylene dioxythiophene (PEDOT), polystyrene sulfone acid, and polyaniline using spin-coating, spraying, doctor blade application and spreading, and inkjet printing. The emitter material layer 4 can be formed by spin-coating, spraying, doctor blade application, scrape-depositing, spreading, and inkjet printing of polyphenylene-vinylene and polyfluorene. When low molecular weight materials are used for the active layers, i.e., the hole injection layer 3 and the emitter material layer 4, the active layers 3 and 4 can be formed by vapor deposition using a metal mask. In FIG. 1, reference numeral 5 denotes incident light, and reference numeral 7 denotes outgoing light.

Figure 2A:
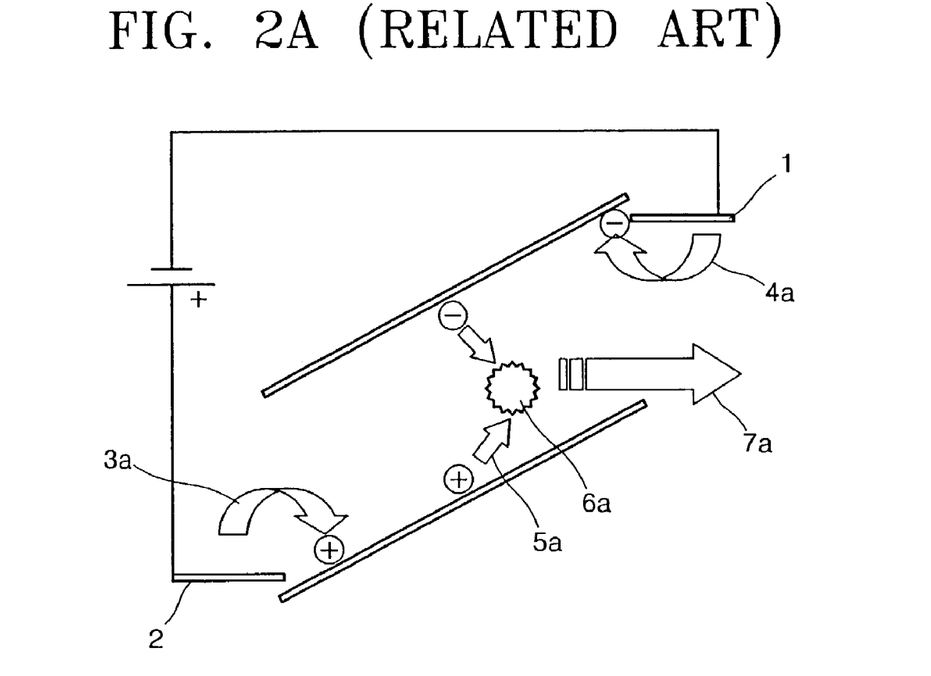
FIG. 2A is a diagram of the PQD shown in FIG. 1 operating in an emissive mode.

Referring to FIG. 2A illustrating emissive mode operation of a PQD, charge carriers are injected into the PQD and recombine (5a) via an excited state accompanied by emission of light (7a). In FIG. 2A, reference character 6a denotes the excited state that is formed as an intermediate. Holes are injected (3a) via the anode 2, which may be indium tin oxide (ITO) or combinations of ITO with conducting polymers like PEDOT. Electrons are injected (4a) via negative cathode 1, a metal, such as calcium or aluminium. The cathode 1 can include isolating layers of inorganic materials which provide a blocking function so that optimal charge injection occurs. A current source is connected between the anode 2 and the cathode 1 of the PQD. Current flow leads to a light emission by an electro-luminescent material. In this emissive mode, the current source is connected to the PQD in a forward direction.

Figure 2B:
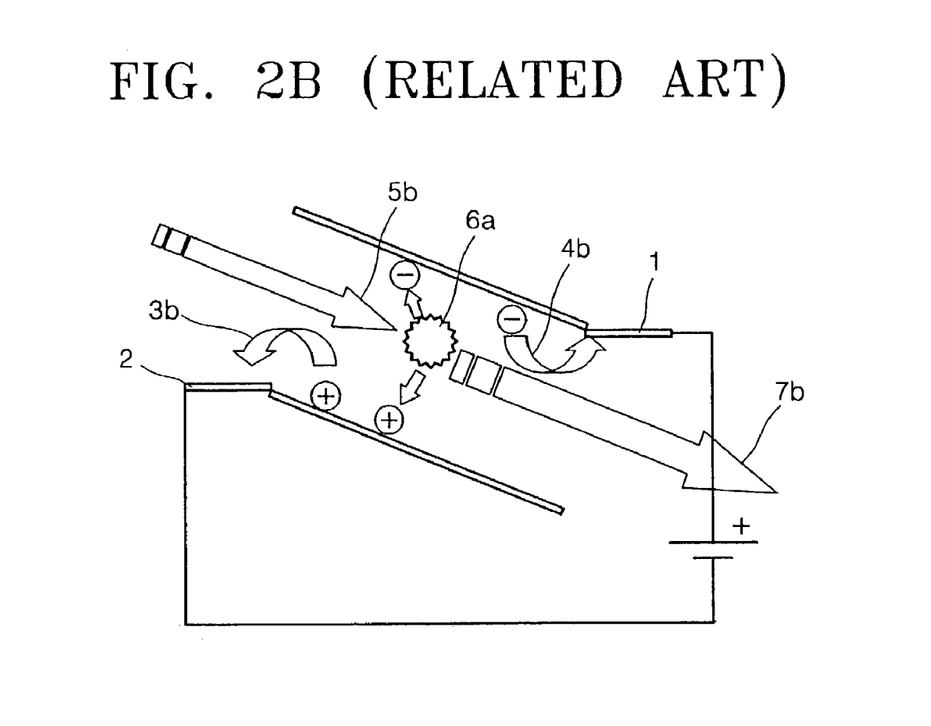
FIG. 2B is a diagram of the PQD shown in FIG. 1 operating in a re-emissive mode.

Referring to FIG. 2B illustrating re-emissive mode operation of a PQD, external light 5b is incident via the emitter material layer 4 shown in FIG. 1 and is transformed into photoluminescence light 7b which is re-emitted. In other words, the display element is operated in a photoluminescence-quenching mode. In this photoluminescence-quenching mode, the photoluminescence emission of an organic material may be suppressed, i.e., quenched, by a reverse electric field. In an initial stage, the emitter material layer 4 is optically excited by the external light 5b. Excitation states decay during a few nanoseconds when photoluminescence emission occurs. The emitted light has a color that depends on the emitter material.

When a reverse voltage is applied between the anode 2 and the cathode 1 of the PQD, an electric field is generated in the emitter material layer 4. This electric field dissociates the excited state 6a before photoluminescence emission occurs. In this way, the overall number of excited states is reduced, and thus the intensity of photoluminescence light is reduced. Accordingly, the intensity of photoluminescence emission can be controlled by the applied voltage. Without an applied voltage, the intensity of photoluminescence emission is at its maximum. With reference to quantum efficiency, the photoluminescence quenching mode has significant advantages. In each quenched excitation, one pair of charge carriers 3b and 4b are absorbed at the anode 2 and cathode 1, sequentially. Meanwhile, in case of using a standard singlet emitter material, the creation of one excited singlet state in the emissive mode will require at least four charge carrier pairs to be injected from the contacts.

Figure 3:
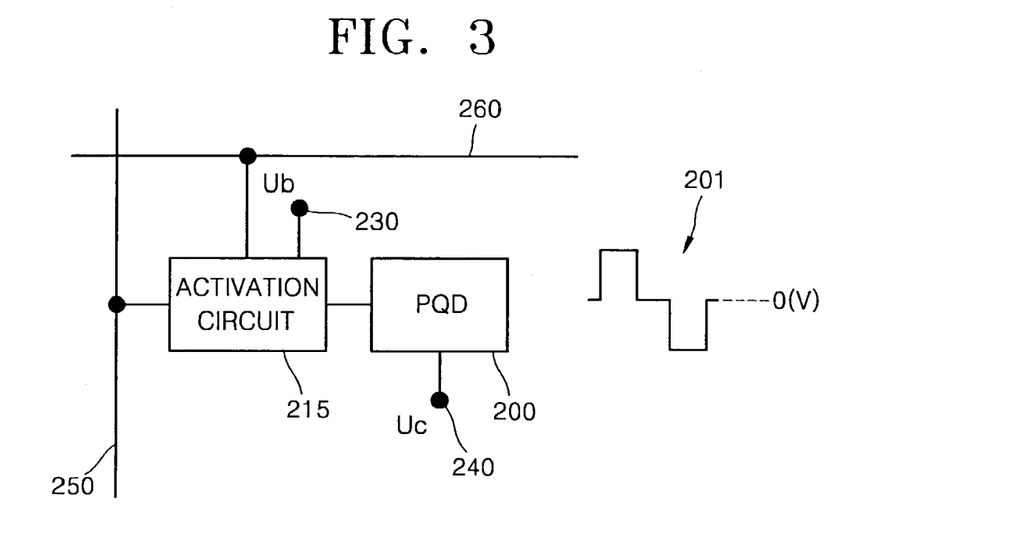
FIG. 3 is a block diagram of a driver circuit for driving the PQD shown in FIG. 1 according to an embodiment of the present invention.

FIG. 3 is a block diagram of a driver circuit according to an embodiment of the present invention for driving the PQD shown in FIG. 1. An activation circuit 215 is connected to a scan line 260, a data line 250, and a reference voltage terminal 230. A PQD 200 is connected between the activation circuit 215 and a cathode voltage terminal 240.

In a line scanning action, by simultaneously applying a scan voltage to the scan line 260 and a data voltage to the data line 250, the activation circuit 215 applies a forward voltage between the anode and the cathode of the PQD 200 for emission mode operation and a reverse voltage between the anode and the cathode of the PQD 200 for photoluminescence quenching operation. For these operations, it is necessary to apply appropriate voltages to the reference and cathode voltage terminals 230 and 240. Reference numeral 201 denotes a voltage applied between the anode and the cathode of the PQD. More particularly, the reference numeral 201 denotes the forward voltage applied during the emission mode operation and the reverse voltage during a re-emission, i.e., quenching operation.

Figure 4:
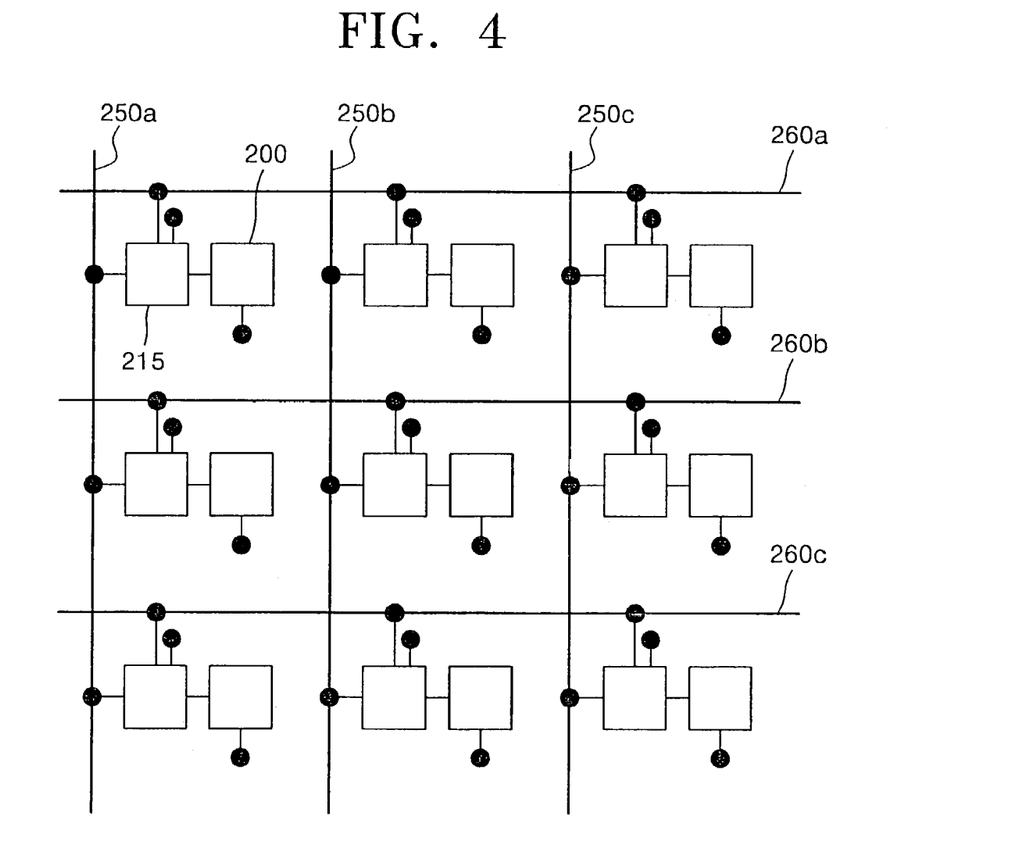
FIG. 4 is a block diagram of a 3×3 PQD matrix display panel including driver circuits as shown in FIG. 3.

When a plurality of the driver circuits are connected to respective crossing points of N scan lines and M data lines, an N×M matrix display panel can be constructed. FIG. 4 shows the driver circuit shown in FIG. 3 applied to a 3×3 PQD matrix display panel. Scan lines 260a, 260b, and 260c are sequentially activated during each scan period in order to reproduce video information using PQDs 200 via activation circuits 215. During each scan period a control voltage is applied to data lines 250a, 250b, and 250c according to the video information. By constant and repetitive scanning, the video information is reproduced as an image on the display panel of the matrix of PQDs.

Figure 5:
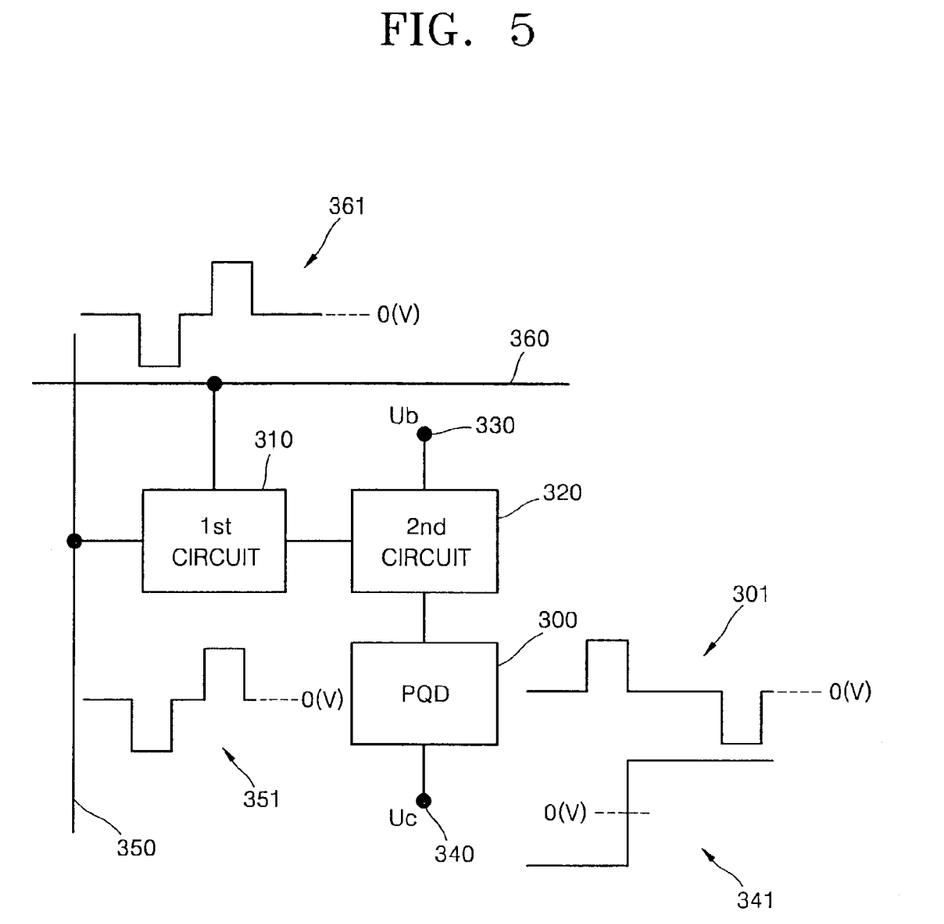
FIG. 5 is a detailed block diagram of the driver circuit shown in FIG. 3.

FIG. 5 is a detailed block diagram of the driver circuit shown in FIG. 3. A first circuit 310 is connected to a scan line 360 and a data line 350. A second circuit 320 is connected to the first circuit 310, a PQD 300, and a reference voltage terminal 330. The PQD 300 is connected between the second circuit 320 and a cathode voltage terminal 340. The following description concerns voltages applied to the reference voltage terminal 330 and individual nodes of the driver circuit.

A zero voltage is applied to the reference voltage terminal 330. The cathode voltage terminal 340 has, relative to the anode of the PQD 300, a negative polarity in an emissive mode operation of the PQD 300 and a positive polarity in a re-emissive mode operation of the PQD 300. In FIG. 5, reference numerals 301, 341, 351, and 361 denote voltage signals applied for both the emissive and re-emissive modes. More specifically, reference numeral 301 denotes a voltage waveform applied between the anode and the cathode of the PQD 300. Reference numeral 341 denotes a voltage waveform applied to the cathode voltage terminal 340. Reference numeral 351 denotes a voltage waveform applied to the data line 350. Reference numeral 361 denotes a voltage waveform applied to the scan line 360.

In a line scanning action, when a negative scan voltage is applied to the scan line 360, the voltage applied to the data line 350 is applied to the second circuit 320 via the first circuit 310, when activated. The second circuit 320 applies the voltage Ub that is applied to the reference voltage terminal 330 to the anode of the PQD 300. Since a negative voltage Uc is applied to the cathode voltage terminal 340 of the PQD 300, a forward voltage is applied between the anode and the cathode of the PQD 300. Accordingly, the PQD 300 emits light and corresponds to a bright pixel. If a voltage of zero volts, instead of the negative voltage, is applied to the data line 350, zero volts is applied to the PQD 300, and thus the PQD 300 does not emit light and corresponds to a dark pixel.

Even if the first circuit 310 is deactivated, by applying zero volts to the scan line 360, the voltage at the PQD 300 remains constant up to the next line scanning action, regardless of the voltage at the data line 350.

The re-emissive mode presupposes the existence of sufficient ambient light for photoluminescence. In a line scanning action, zero volts is applied to the scan line 360 connected to the first circuit 310, and a positive voltage Uc is applied to the cathode voltage terminal 340 of the PQD 300. Under these conditions, if zero volts is applied to the data line 350, the second circuit 320 applies a reverse voltage between the anode and the cathode of the PQD 300 for photoluminescence quenching. Accordingly, the PQD corresponds to a dark pixel. If a positive voltage, instead of zero volts, is applied to the data line 350, no voltage is applied between the anode and the cathode of the PQD 300, and thus the PQD corresponds to a bright pixel due to photoluminescence.

Even if the first circuit 310 is turned off by applying a positive voltage to the scan line 360, the voltage at the PQD 300 remains constant up to the next line scan action, regardless of the voltage at the data line 350.

Figure 6:
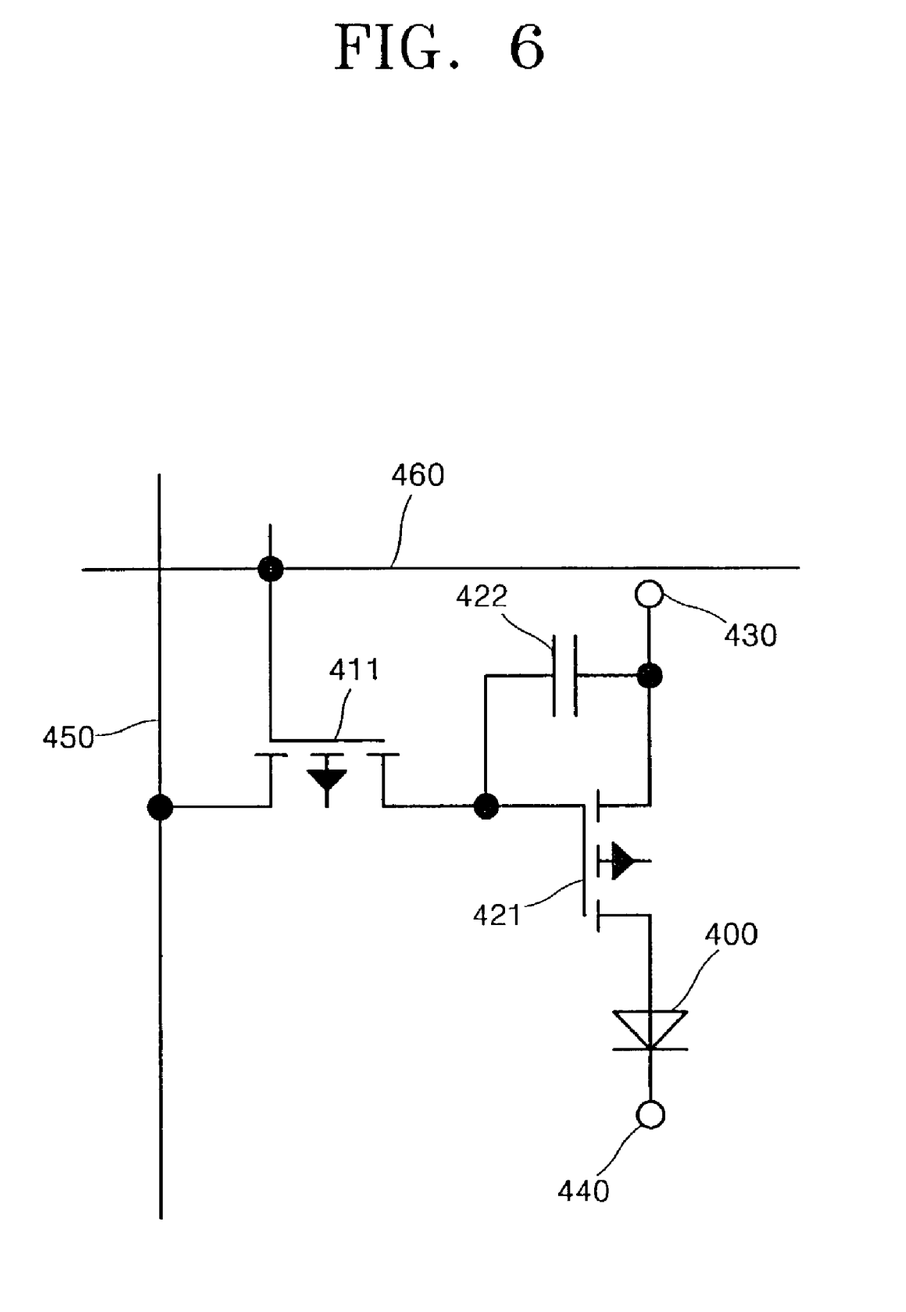
FIG. 6 is a diagram of the driver circuit shown in FIG. 5, which includes P-channel thin film polysilicon field effect transistors (FETs)

FIG. 6 is a diagram of the driver circuit shown in FIG. 5, which includes P-channel thin film polysilicon field effect transistors (FETs). For reasons of simplicity, we refer only to a pixel circuit that is based on P-channel thin film polysilicon FETs. A driver circuit based on N-channel thin film polysilicon FETs or a combination of N-channel and P-channel thin film polysilicon FETs can also be used.

Referring to FIG. 6, the driver circuit for a PQD 400 according to the present invention includes an activation transistor 411 as the first circuit and a driver transistor 421 as part of a second circuit.

The gate of the activation transistor 411 is connected to a scan line 460. The source of the activation transistor 411 is connected to a data line 450. The driver transistor 421 supplies necessary voltages and currents for emissive and re-emissive modes to the PQD 400. The gate of the driver transistor 421 is connected to the drain of the activation transistor 411. The source of the driver transistor 421 is connected to a reference voltage terminal 430, and the drain is connected to the PQD 400. A storage capacitor 422 is connected between the gate and the source of the driver transistor 421. A voltage applied to the reference voltage terminal 430 is referred to as a reference voltage. In an embodiment of the present invention, zero volts is applied as the reference voltage. In a line scanning action in an emissive mode (corresponding to time ranges A and B in FIG. 9, described below), upon applying a negative voltage to the scan line 460, the activation transistor 411 is turned on, and thus a negative voltage at the data line 450 is applied to the gate of the driver transistor 421. The driver transistor 421 is turned on, and, thus, the negative voltage is applied to the cathode 440 of the PQD 400, so that a forward voltage is applied between the anode and the cathode of the PQD 400. Accordingly, the PQD emits light and corresponds to a bright pixel. If zero volts is applied to the data line 450, the driver transistor 421 is turned off, and thus no voltage is applied between the anode and the cathode of the PQD 400. Accordingly, the PQD 400 corresponds to a dark pixel.

Even if the activation transistor 411 is turned off, by applying zero volts to the scan line 460, the voltage applied to the PQD 400 is continuously and constantly applied to the PQD 400 until the next line scanning action, regardless of the voltage at the data line 450. The storage capacitor 422 maintains constant the voltage applied to the gate and the source of the driver transistor 421, up to the next line scanning action. In the emissive mode, in order to turn on both transistors 411 and 421, the potential of the scan line 460 must be smaller than the sum of the potential of the data line 450 and the threshold voltage of the activation transistor

411, and the potential of the data line 450 must be smaller than the threshold voltage of the driver transistor 421.

Table 1 summarizes the functions of voltages applied to P-channel thin film polysilicon FETs, which have a threshold voltage of −2.5 V, in the emissive mode.

TABLE 1

| Related reference numeral | Item | Value | Unit | Functions |
|---|---|---|---|---|
| 430 | Reference voltage | 0 | V | Reference voltage |
| 440 | Cathode voltage | −12 | V | Cathode voltage |
| 460 | Scan voltage | −15 | V | Activation transistor 411 is turned on, and thus the data voltage is programmed. |
| 460 | Scan voltage | 0 | V | Activation transistor 411 is turned on, and thus the data voltage is not programmed. The data voltage remains stored in the storage capacitor 422. The pixel remains dark or bright depending on the previously programmed data voltage. |
| 450 | Data voltage | −10 | V | If the activation transistor 411 is turned on, the driver transistor 421 is turned on. The PQD 400 emits light in response to a forward voltage. If the activation transistor 411 is turned off, no change occurs. |
| 450 | Data voltage | 0 | V | If the activation transistor 411 is turned on, the driver transistor 421 is turned off. Since no voltage is applied to the PQD 400, emission does not occur. If the activation transistor 411 is turned off, no change occurs. |

A re-emissive mode (corresponding to time ranges C and D in FIG. 9) presupposes the existence of sufficient ambient light for photoluminescence. In a line scanning action, if zero volts is applied to the scan line 460 when a positive voltage is applied to the cathode 440 of the PQD 400, the activation transistor 411 is turned on. If zero volts is applied to the data line 450, the driver transistor 421 is turned on, and thus a reverse voltage for photoluminescence quenching is applied between the anode and the cathode of the PQD 400. Accordingly, the PQD 400 corresponds to a dark pixel. If a positive voltage, instead of zero volts, is applied to the data line 450, no voltage is applied between the anode and the cathode of the PQD 400. Accordingly, photoluminescence occurs, and the PQD 400 corresponds to a bright pixel.

Even if the activation transistor 411 is turned off, by applying a positive voltage to the scan line 460, the voltage applied to the PQD 400 is continuously and constantly applied to the PQD 400 until the next line scanning action, regardless of the voltage at the data line 450. The storage capacitor 422 maintains constant the voltage applied to the gate and the source of the driver transistor 421, until the next line scanning action. In the re-emissive mode, in order to turn off the activation transistor 411, the potential of the scan line 460 must be greater than the potential of the data line 450. In order to turn off the driver transistor 421, the potential of the data line 450 must be greater than a difference between the potential of the cathode 440 and the threshold voltage of the driver transistor 421.

Table 2 summarizes the functions of voltages applied to P-channel thin film polysilicon FETs, which have a threshold voltage of −2.5 V, in the re-emissive mode.

TABLE 2

| Related reference numeral | Item | Value | Unit | Functions |
|---|---|---|---|---|
| 430 | Reference voltage | 0 | V | Reference voltage |
| 440 | Cathode voltage | +17 | V | Cathode voltage |
| 460 | Scan voltage | 0 | V | Activation transistor 411 is turned on, and thus the data voltage is programmed. |
| 460 | Scan voltage | +23 | V | Activation transistor 411 is turned on, and thus the data voltage is not programmed. The data voltage remains stored in the storage capacitor 422. The pixel remains dark or bright depending on the previously programmed data voltage. |
| 450 | Data voltage | 0 | V | If the activation transistor 411 is turned on, the driver transistor 421, is turned on. The PQD 400 does not emit light in response to a reverse voltage. If the activation transistor 411 is turned off, no change occurs. |
| 450 | Data voltage | +20 | V | If the activation transistor 411 is turned on, the driver transistor 421 is turned off. Since no voltage is applied to the PQD 400, emission is performed. If the activation transistor 411 is turned off, no change occurs. |

Figure 7:
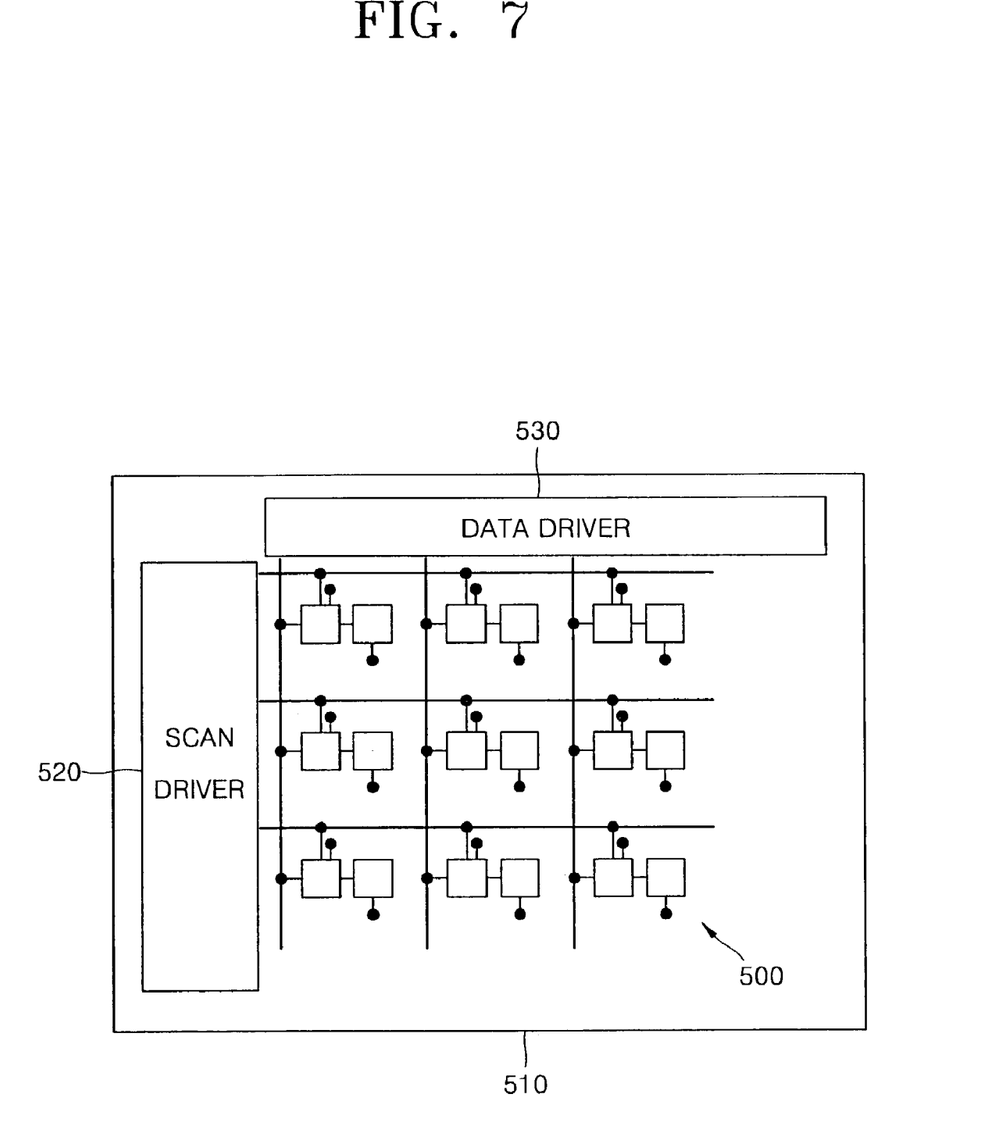
FIGS. 7 and 8 are detailed block diagrams of a 3×3 PQD matrix display panel including driver circuits as shown in FIG. 5.
Figure 8:
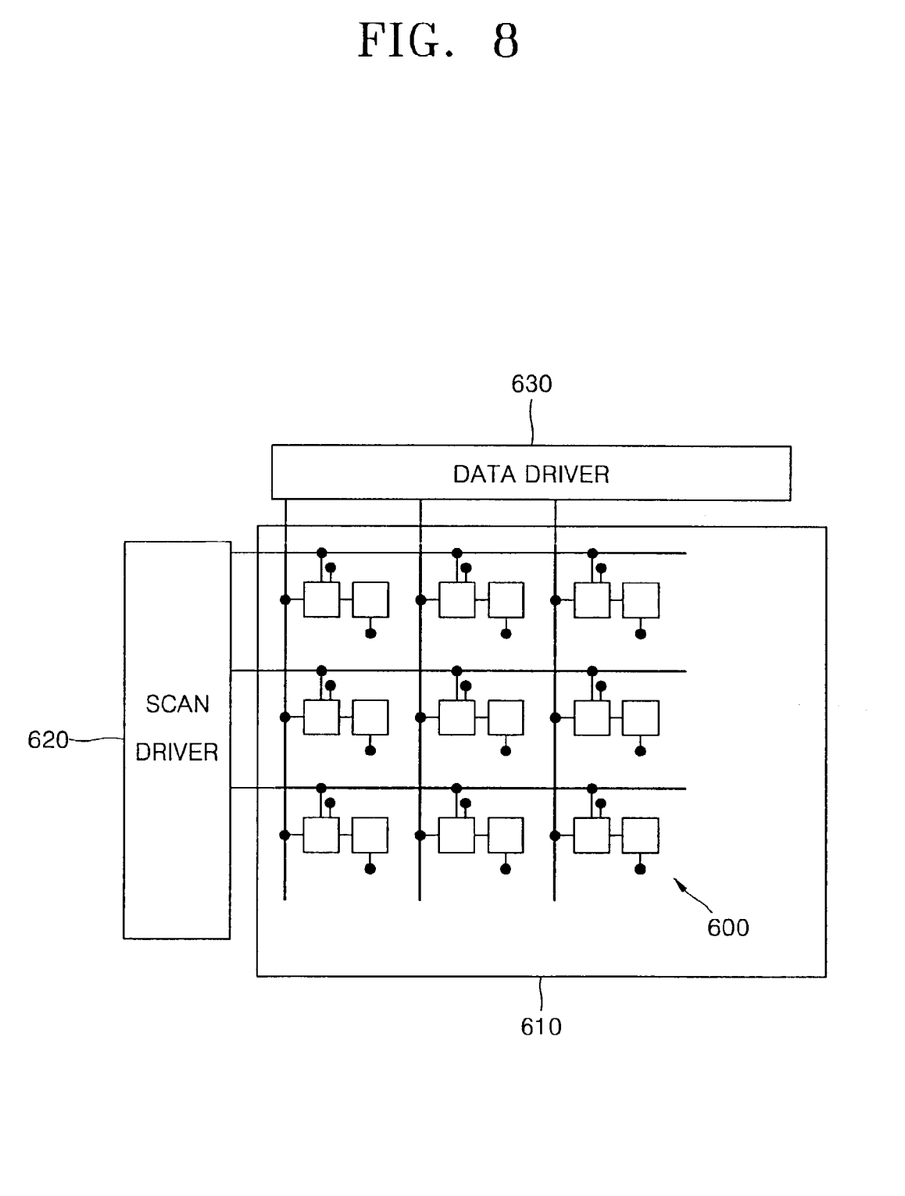

FIGS. 7 and 8 show the driver circuit shown in FIG. 5 applied to a 3×3 PQD matrix display panel. In FIG. 7, a scan driver 520 and a data driver 530, which are used to generate the driving signals, are located within a display panel 510 together with a PQD matrix 500. In FIG. 8, a PQD matrix 600 is located within a display panel 610, and a scan driver 620 and a data driver 630 are located outside the display panel 610.

Figure 9:
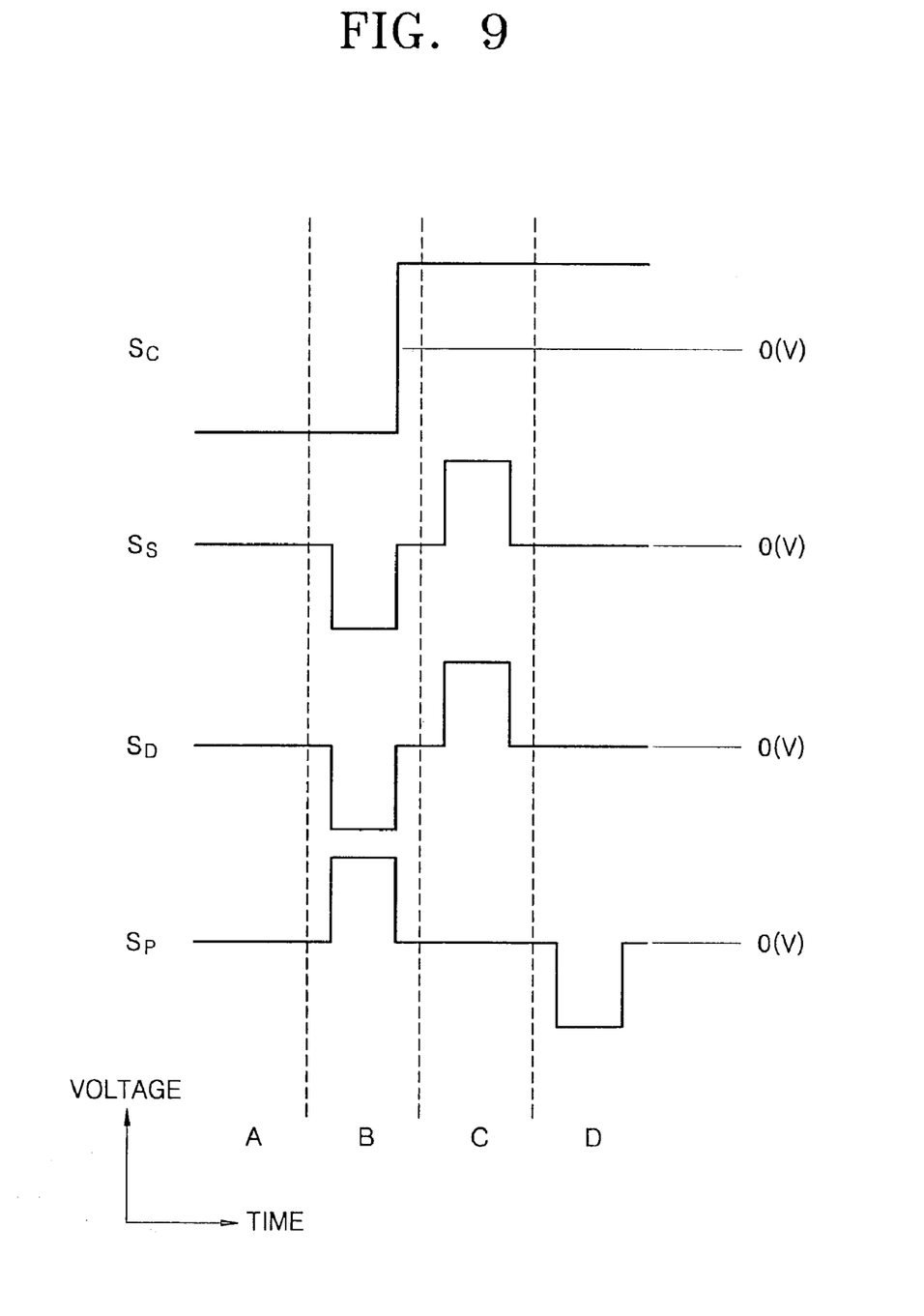
FIG. 9 is a timing chart showing the voltage waveforms of signals in the driver circuit shown in FIG. 6.

FIG. 9 shows the voltage waveforms of signals in the driver circuit shown in FIG. 6. In FIG. 9, reference character $S_C$ denotes a voltage waveform applied to the cathode 440 of the PQD 400. Reference character $S_S$ denotes a voltage waveform applied to the scan line 460. Reference character $S_D$ denotes a voltage waveform applied to the data line 450. Reference character $S_P$ denotes a voltage waveform applied between the anode and the cathode of the PQD 400. The levels of the voltage waveforms are related to the voltage applied to the reference voltage terminal 430. A voltage of 0 V is applied to the reference voltage terminal 430. In the time ranges A and B, emissive mode operation is possible. In the time ranges C and D, re-emissive mode operation is possible. The brightness of the PQD 400 depends on the applied forward and reverse voltages. In other words, in the emissive mode, a forward voltage is applied between the anode and the cathode of each PQD 400 according to the gray scale value of the PQD 400. In the re-emissive mode, a reverse voltage is applied between the anode and the cathode of each PQD 400 according to the gray scale value of the PQD 400. The absolute value of the forward voltage applied between the anode and the cathode of each PQD 400 in the emissive mode is proportional to the gray scale value of the PQD 400. The absolute value of the reverse voltage applied between the anode and the cathode of each PQD 400 in the re-emissive mode is inversely proportional to the gray scale value of the PQD 400. Accordingly, the gray scale values of the display elements can be controlled by the control voltage, i.e., the data voltage. In other words, a gray scale display can be produced in a display panel according to the invention. Meanwhile, it is also possible that the source and drain of the transistors are interchanged in contrast to the circuit in FIG. 6.

As described above, a driver circuit according to the present invention can operate PQDs in both the emissive and re-emissive modes depending on the operation of an activation transistor and the operation of a driver transistor of the driver circuit. The PQDs can be operated in the emissive mode in low ambient light and in the re-emissive mode under conditions with high ambient light. Accordingly, satisfactory brightness can be obtained under conditions of high ambient light with low current so that the power consumption and fabrication cost of a display incorporating the PQDs and driver circuits can be reduced.

The present invention is not restricted to the embodiment described above, and it will be apparent that various changes can be made by those skilled in the art without departing from the spirit of the invention.

What is claim is:

1. A circuit for producing light at a plurality of gray scale values, the circuit comprising:
    a photoluminescence quenching device (PQD) having an anode and a cathode, and defined as a pixel, the PQD being connected to a driving circuit at a crossing of a scan line and a data line, the driving circuit comprising:
        an activation transistor having a control electrode connected to the scan line and an input electrode connected to the data line, the activation transistor being turned on in response to potential of the scan line, and, when turned on, outputting potential of the data line; and
        a driver transistor having a control electrode connected to an output electrode of the activation transistor, the driver transistor being connected between a reference voltage terminal of the circuit and the PQD and, when the activation transistor is turned on, applying to the anode of the PQD the potential that is applied to the reference voltage terminal, according to the potential of the data line, wherein
            in an emissive mode of operation of the PQD, when the driver transistor is turned on, a forward voltage is applied between the anode and the cathode of the PQD so that the PQD emits light according to a gray scale value, and
            in a re-emissive mode of operation of the PQD in which the PQD can produce light by photoluminescence, when the driver transistor is turned off, a reverse voltage is applied between the anode and the cathode of the PQD to produce light according to a gray scale value.

2. The circuit of claim 1, wherein, in the emissive mode, a negative voltage, with respect to the voltage that is applied to the reference voltage terminal, is applied to the cathode of the PQD.

3. The circuit of claim 2, wherein, in the re-emissive mode, a positive voltage, with respect to the voltage that is applied to the reference voltage terminal, is applied to the cathode of the PQD.

4. The circuit of claim 1, wherein the activation transistor and the driver transistor are field effect transistors (FETs) having gate electrodes as control electrodes, and source and drain electrodes as input and output electrodes.

5. The circuit of claim 4, wherein the activation transistor and the driver transistor are P-channel FETs, the reference voltage terminal is connected to the source electrode of the driver transistor, and including a storage capacitor connected between the gate electrode and the source electrode of the driver transistor.

6. The circuit of claim 5, wherein the gate electrode of the activation transistor is connected to the scan line.

7. The circuit of claim 6, wherein the source electrode of the activation transistor is connected to the data line.

8. The circuit of claim 7, wherein the gate electrode of the driver transistor is connected to the drain electrode of the activation transistor.

9. The circuit of claim 8, wherein the drain electrode of the driver transistor is connected to the anode of the PQD.

10. The circuit of claim 1, wherein, in the emissive mode, when the driver transistor is turned off, and no voltage is applied between the anode and the cathode of the PQD, the PQD does not emit light.

11. The circuit of claim 1, wherein, in the re-emissive mode, when the driver transistor is turned on, and a reverse voltage is applied between the anode and the cathode of the PQD, the PQD does not emit light.

12. A matrix display apparatus comprising:
    a plurality of scan lines;
    a plurality of data lines, orthogonal to and crossing the scan lines;
    a plurality of photoluminescence quenching devices (PQDs), each PQD having an anode and a cathode, defining a pixel, and being located at a respective crossing of one of the scan lines and one of the data lines; and
    a plurality of driving circuits, each driving circuit driving a corresponding PQD and applying a forward voltage between the anode and the cathode of the corresponding PQD, according to a gray scale value, in an emissive mode of operation of the corresponding PQD, and applying a reverse voltage between the anode and the cathode of the corresponding PQD, according to the gray scale value, in a re-emissive mode of operation of the corresponding PQD.

13. The matrix display apparatus of claim 12, wherein the forward voltage applied between the anode and the cathode of the corresponding PQD in the emissive mode has an absolute value proportional to the gray scale value.

14. The matrix display apparatus of claim 12, wherein the reverse voltage applied between the anode and the cathode of the corresponding PQD in the re-emissive mode has an absolute value inversely proportional to the gray scale value.

15. The matrix display apparatus of claim 12, wherein each of driving circuits comprises:
    an activation transistor having a control electrode connected to a respective scan line and an input electrode connected to a respective data line, the activation transistor being turned on in response to potential of the respective scan line, and, when turned on, outputting potential according to the respective data line; and
    a driver transistor having a control electrode connected to an output electrode of the activation transistor, the driver transistor being connected between a reference voltage terminal of the driving circuit and the corresponding PQD and, when the activation transistor is turned on, applying to the anode of the corresponding PQD the potential that is applied to the reference voltage terminal, according to the potential of the respective data line.

16. The matrix display apparatus of claim 15, wherein, in the emissive mode, the corresponding driver circuit applies a negative voltage with respect to a voltage applied to the reference voltage terminal of the driver circuit, to the cathode of the corresponding PQD.

17. The matrix display apparatus of claim 16, wherein, in the re-emissive mode, the corresponding driver circuit applies a positive voltage, with respect to a voltage applied to the reference voltage terminal, of the driver circuit, to the cathode of the corresponding PQD.

18. The matrix display apparatus of claim 15, wherein the activation transistor and the driver transistor of each driver circuit are field effect transistors having gate electrodes as control electrodes, and source and drain electrodes as input and output electrodes.

19. The matrix display apparatus of claim 18, wherein the reference voltage terminal is connected to the source electrode of the driver transistor of the driver circuit, and each driver circuit includes a corresponding storage capacitor connected between the gate electrode and the source electrode of the driver transistor of the respective driver circuit.

20. The circuit of claim 1, wherein, in the re-emissive mode, when the driver transistor is turned off and no voltage is applied between the anode and the cathode of the PQD, the PQD produces light by photoluminescence.

* * * * *